(12) United States Patent
Scott et al.

(10) Patent No.: US 7,510,418 B1
(45) Date of Patent: Mar. 31, 2009

(54) LOADING MECHANISMS FOR INTEGRATED CIRCUIT (IC) PACKAGES

(75) Inventors: Ward Scott, Chandler, AZ (US); Hong Xie, Phoenix, AZ (US); Ioan Sauciuc, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/931,805

(22) Filed: Oct. 31, 2007

(51) Int. Cl.
*H01R 13/62* (2006.01)

(52) U.S. Cl. ..................... 439/331

(58) Field of Classification Search ............ 439/331, 439/487; 361/704, 709–711, 719
See application file for complete search history.

(56) References Cited

U.S. PATENT DOCUMENTS 4,712,159 A * 12/1987 Clemens .............. 361/717
6,414,846 B1 * 7/2002 Chen ................... 361/704
6,707,672 B2 * 3/2004 Liu .................... 361/704

\* cited by examiner

*Primary Examiner*—Phuong K Dinh
(74) *Attorney, Agent, or Firm*—Grossman, Tucker, Perreault & Pfleger PLLC

(57) ABSTRACT

Disclosed is a socket assembly comprising a retention mechanism, a circuit board, an IC socket, a heat sink unit and a loading mechanism. The retention mechanism includes a support plate, on which the circuit board, the IC socket comprising die and package, and the heat sink unit are stacked respectively. The retention mechanism further includes a plurality of standoffs perpendicular to the support plate and include a pair of latches at different heights. The loading mechanism includes a loading plate configured on end portions of the standoffs and a pair of downwardly extending clips that are capable of engaging to the latches on the both standoffs. Correspondingly, the circuit board, the IC socket and the heat sink unit are sandwiched between the loading plate and the support plate. The heights of the pair of latches on the standoffs are based on the die and package in the IC socket.

7 Claims, 4 Drawing Sheets

US 7,510,418 B1

LOADING MECHANISMS FOR INTEGRATED CIRCUIT (IC) PACKAGES

FIELD OF THE DISCLOSURE

The present disclosure generally relates to IC packages and, more particularly, to loading mechanisms for Integrated Circuit (IC) packages.

BRIEF SUMMARY OF INVENTION

Disclosed is a socket assembly comprising a retention mechanism, a circuit board, an IC socket, a heat sink unit and a loading mechanism. The retention mechanism includes a support plate, on which the circuit board, the IC socket comprising die and package, and the heat sink unit are stacked respectively. The retention mechanism further includes a plurality of standoffs perpendicular to the support plate and include a pair of latches at different heights. The loading mechanism includes a loading plate configured on end portions of the standoffs and a pair of downwardly extending clips that are capable of engaging to the latches on the both standoffs. Correspondingly, the circuit board, the IC socket and the heat sink unit are sandwiched between the loading plate and the support plate. The heights of the pair of latches on the standoffs are based on the die and package in the IC socket.

BRIEF DESCRIPTION OF THE DRAWINGS

The advantages and features of the present disclosure will become better understood with reference to the following detailed description and claims taken in conjunction with the accompanying drawings, wherein like elements are identified with like symbols, and in which:

Like reference numerals refer to like parts throughout the description of several views of the drawings.

DETAILED DESCRIPTION OF THE DISCLOSURE

For a thorough understanding of the present disclosure, reference is to be made to the following detailed description, including the appended claims, in connection with the above-described drawings. Although the present disclosure is described in connection with exemplary embodiments, the disclosure is not intended to be limited to the specific forms set forth herein. It is understood that various omissions and substitutions of equivalents are contemplated as circumstances may suggest or render expedient, but these are intended to cover the application or implementation without departing from the spirit or scope of the claims of the present disclosure. Also, it is to be understood that the phraseology and terminology used herein is for the purpose of description and should not be regarded as limiting.

The terms "first," "second," and the like, herein do not denote any order, quantity, or importance, but rather are used to distinguish one element from another. The terms "a" and "an" herein do not denote a limitation of quantity, but rather denote the presence of at least one of the referenced item.

Figure 1A:
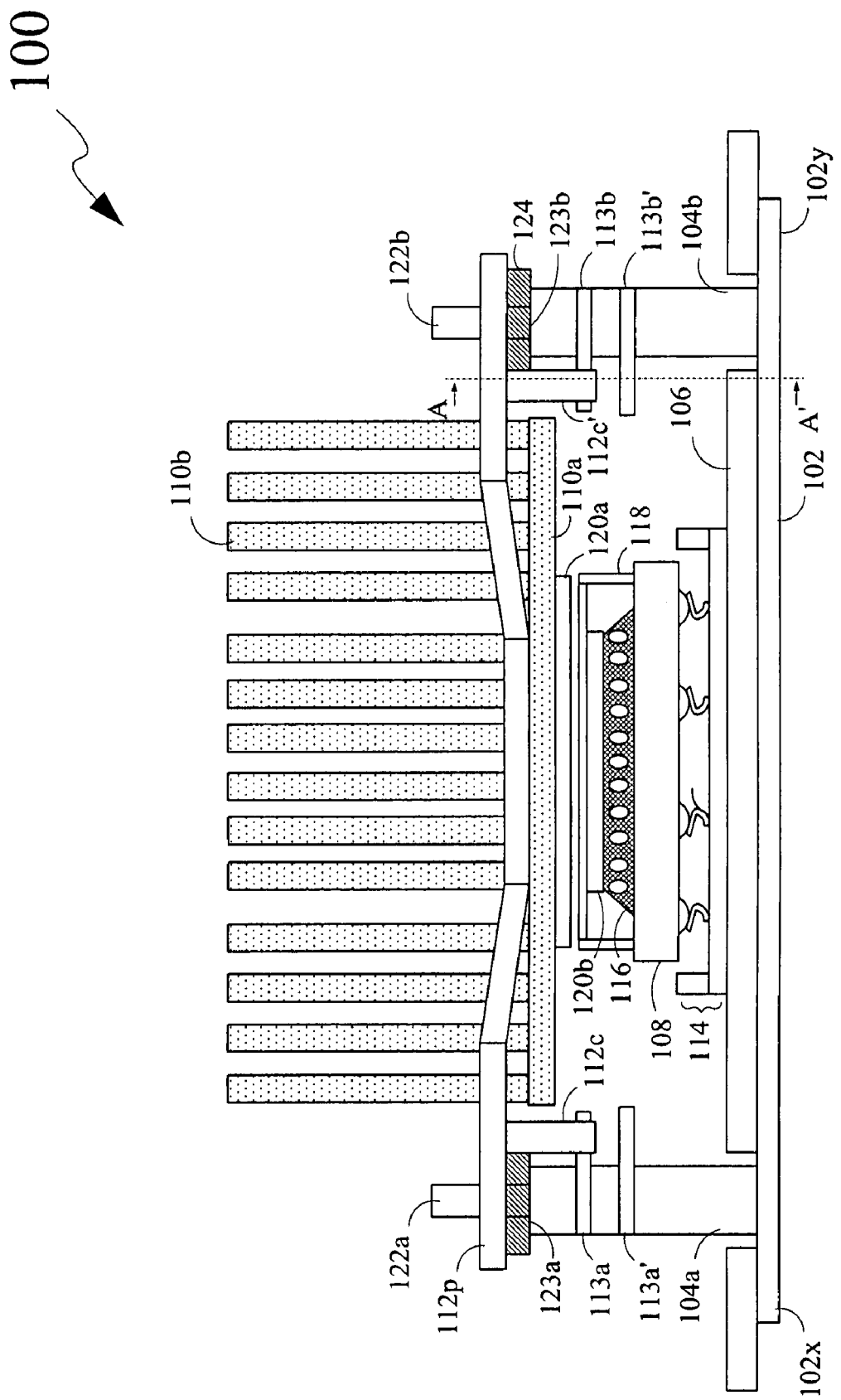
FIG. 1A is a front-view of a socket assembly, according to an exemplary embodiment of the present disclosure.

FIG. 1A is a front-view of a socket assembly 100, according to an exemplary embodiment of the present disclosure. The socket assembly 100 includes a retention mechanism comprising a support plate 102 and a plurality of standoffs 104a and 104b, a circuit board 106, an Integrated Circuit (IC) socket 108, a heat sink unit depicted by 110a and 110b (hereinafter after referred to as 'heat sink unit 110') and a loading mechanism depicted by 112p, 112c and 112c'. The retention mechanism is configured to retain a variety of IC packages, such as a bare die package, an Integrated Heat Spreader (IHS) package, and the like. The support plate 102 of the retention mechanism supports the socket assembly 100 in entirety. Although the retention mechanism is shown to include only two standoffs 104a and 104b in FIG. 1A, the retention mechanism may include more than two similar standoffs. The standoffs 104a and 104b are disposed on two opposite end portions 102x and 102y of the support plate 102, as shown in FIG. 1A.

The standoffs 104a and 104b are oriented in a perpendicular direction to the support plate 102. The standoffs 104a and 104b may be configured as cuboids as shown in FIG. 1A. However, it may be apparent to a person ordinarily skilled in the art that the standoffs 104a and 104b may be of any other shape, such as cylindrical, cubical, and the like. Each of the standoffs 104a and 104b includes a pair of latches. For example, the standoff 104a includes a pair of latches 113a and 113a' and the standoff 104b includes a pair of latches 113b and 113b' respectively. The latches 113a and 113a' are hinged at the lateral surface (not shown) of standoff 104a at different heights from the support plate 102. Similarly, the latches 113b and 113b' are hinged at the lateral surface (not shown) of the standoff 104b at different heights from the support plate 102. Further, the latches 113a and 113b are hinged at the same height of the standoffs 104a and 104b respectively. Similarly, the latches 113a' and 113b' are hinged at the same height of the standoffs 104a and 104b respectively.

The standoffs 104a and 104b are disposed on the two opposite end portions 102x and 102y of the support plate 102 and at least a portion of the circuit board 106 (hereinafter referred to as 'circuit board 106') is disposed on the support plate 102 between the standoffs 104a and 104b. The circuit board 106 may include, but is not limited to, a printed circuit board (PCB) and printed wiring board (PWB). The circuit board 106 has connectors (not shown) on top surface of the circuit board 106 that connect circuit board 106 to an IC socket 108. The IC socket 108 is configured on the circuit board 106. The IC socket 108 may be preferably a Land Grid Array (LGA) socket that includes LGA socket-board connectors 114 to electrically connect the IC socket 108 to the circuit board 106. The IC socket 108 may also include other sockets such as Pin Grid Array (PGA) type socket instead of LGA socket. It should be noted that the LGA socket-board connectors 114 are configured between the IC socket 108 and the circuit board 106 as shown in FIG. 1A, and that the representation in FIG. 1A is for the exemplary purposes only and should not be considered limiting.

The IC socket 108 at least partially accommodates a die and a package (hereinafter referred to as 'die package 116'). The die package 116 may be an Integrated Heat Spreader (IHS) package or a bare die package. The die package 116, as shown in FIG. 1A, depicts the IHS package. The IHS package includes an IHS lid 118 in addition to the die package 116, which is positioned above the die package 116. The IHS lid 118 facilitates the transfer of heat from at least one of the die and the package of the die package 116 to the heat sink unit 110. In this exemplary embodiment of the present disclosure, the IHS lid 118 connects the die package 116 to the heat sink unit 110 through the thermal interface material (TIM) layers 120a and 120b. The TIM layers 120a and 120b are formed above and below the IHS lid 118.

The socket assembly 100 includes the heat sink unit 110 configured above the IC socket 108 to conduct heat from at least one of the package and the die of the die package 116. The heat sink unit 110 includes a heat sink base 110a and a plurality of fins 110b. The heat sink base 110a is configured to be in contact with the die of the IC socket 108 through the IHS lid 118 and TIM layers 120a and 120b therebetween. The heat sink base 110a dissipates heat that originates from the package or the die of the die package 116 due to continuous operation. The heat is dissipated from the fins 110b. In this embodiment of the present disclosure, the fins 110b are configured perpendicular to the top surface (not shown) of the heat sink base 110a. This configuration helps in dissipating heat faster due to greater surface area of the fins 110b. However, it will be apparent to a person ordinarily skilled in the art that the fins 110b may be configured in any other direction which makes heat dissipation an efficient process. The heat sink base 110a, the IC socket 108 and the circuit board 106 are adapted to be sandwiched between the retention mechanism and the loading mechanism.

The loading mechanism comprises a loading plate 112p and a plurality of clips 112c and 112c'. The loading plate 112p is configured on the end portions of the standoffs 104a and 104b as shown in FIG. 1A such that the loading plate 112p lies above the heat sink base 110a. The loading plate 112p rests on the end portions of the standoffs 104a and 104b. The clips 112c and 112c' are hinged at end portions of the loading plate 112p and may be downwardly oriented as shown in FIG. 1A. The clip 112c may engage one of the latch 113a and the latch 113a'. Similarly, the clip 112c' may engage one of the latches 113b and 113b'. As previously described, the latches 113a and 113b are hinged at the same height of the standoffs 104a and 104b respectively and the latches 113a' and 113b' are hinged at the same height of the standoffs 104a and 104b respectively. Hence the clips 112c and 112c' engage either the latches 113a and 113b or with the latches 113a' and 113b'. The height of the latches 113a and 113b and the height of the latches 113a' and 113b' are chosen depending upon a geometry of the die package 116. For example, the die package 116, such as the IHS package, and the bare die package have different heights in the socket assembly 100. More specifically, the height of the IHS package is greater as compared to the bare die packages due to the IHS lid 118 attached with the die package 116.

Therefore, when the die package 116 is the bare die package in the socket assembly 100, the clips 112c and 112c' may be engaged to the latches 113a' and 113b' respectively. Similarly, in case of the die package 116 being the IHS package in the socket assembly 100, the clips 112c and 112c' may be engaged to the latches 113a and 113b respectively. In this case, the loading plate 112p rests on the end portions 122a and 122b of the standoffs 104a and 104b above washers 124 placed thereon. The end portions 122a and the 122b may be cylindrical or rectangular in shape and may extend perpendicularly upward from longitudinal top surfaces 123a and 123b of the standoffs 104a and 104b respectively. The end portions 122a and 122b may be dimensioned to extend above the longitudinal top surfaces 123a and 123b of the standoffs 104a and 104b such that they provide enough space to accommodate the washers 124 on the longitudinal top surfaces 123a and 123b. The washers 124 are configured to support the loading plate 112p as shown in FIG. 1A. The washers 124 may be included when an IHS package is being used.

Based on the above discussions, it will be apparent to a person skilled in the art that the when the clips 112c and 112c' are engaged to the latches 113a and 113b respectively, the heat sink base 110a, the IC socket 108 and the circuit board 106 are sandwiched between the loading plate 112p and the support plate 102. In this case, the die package 116 is of the type of the IHS package. Similarly, when the clips 112c and 112c' are engaged to the latches 113a' and 113b' respectively, the heat sink base 110a, the IC socket 108 and the circuit board 106 are sandwiched between the loading plate 112p and the support plate 102. In this case the die package 116 is of the type of the bare die package. The loading plate 112p may be disposed on the HIS or partially on the HIS and partially on a CPU substrate and socket.

Figure 1B:
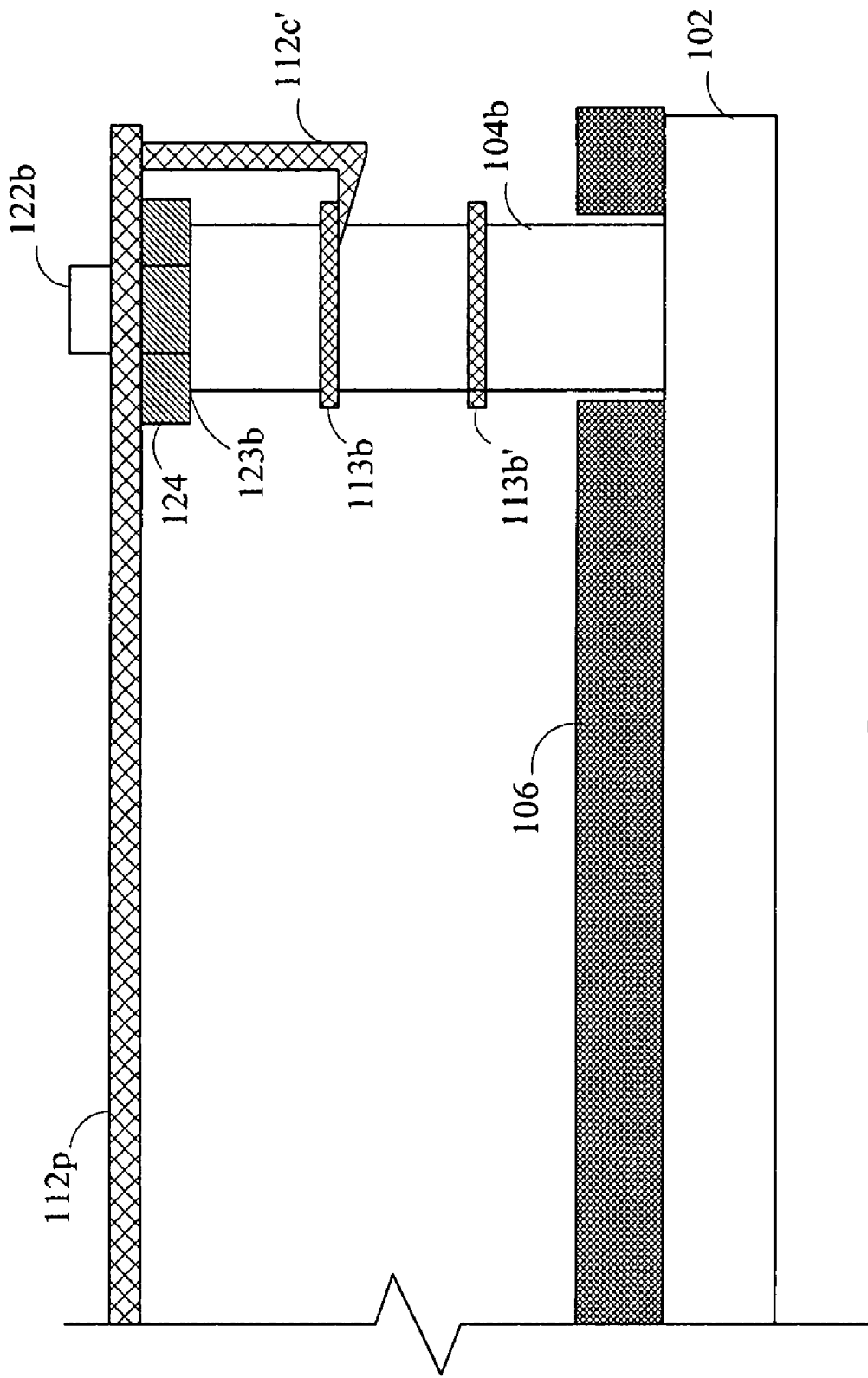
FIG. 1B is a sectional view along A-A' of a part of the socket assembly of FIG. 1A, according to an exemplary embodiment of the present disclosure.

Referring now to FIG. 1B, a sectional view along A-A' of a part of the socket assembly 100 of FIG. 1A is shown, according to an exemplary embodiment of the present disclosure. The sectional view includes view of the support plate 102, the standoff 104b, the circuit board 106, loading plate 112p, the clip 112c', the latches 113b and 113b' and the washer 124. FIG. 1B illustrate the engagement of the clip 112c' with the latch 113b, and the washer 124 between the standoff 104b and the loading plate 112. Such an arrangement, i.e. the use of the washer 124 is required in the case of the IHS package. In case of the bare die package, the washer 124 may be removed in order to engage the clip 112c' to the latch 113b'.

Figure 2:
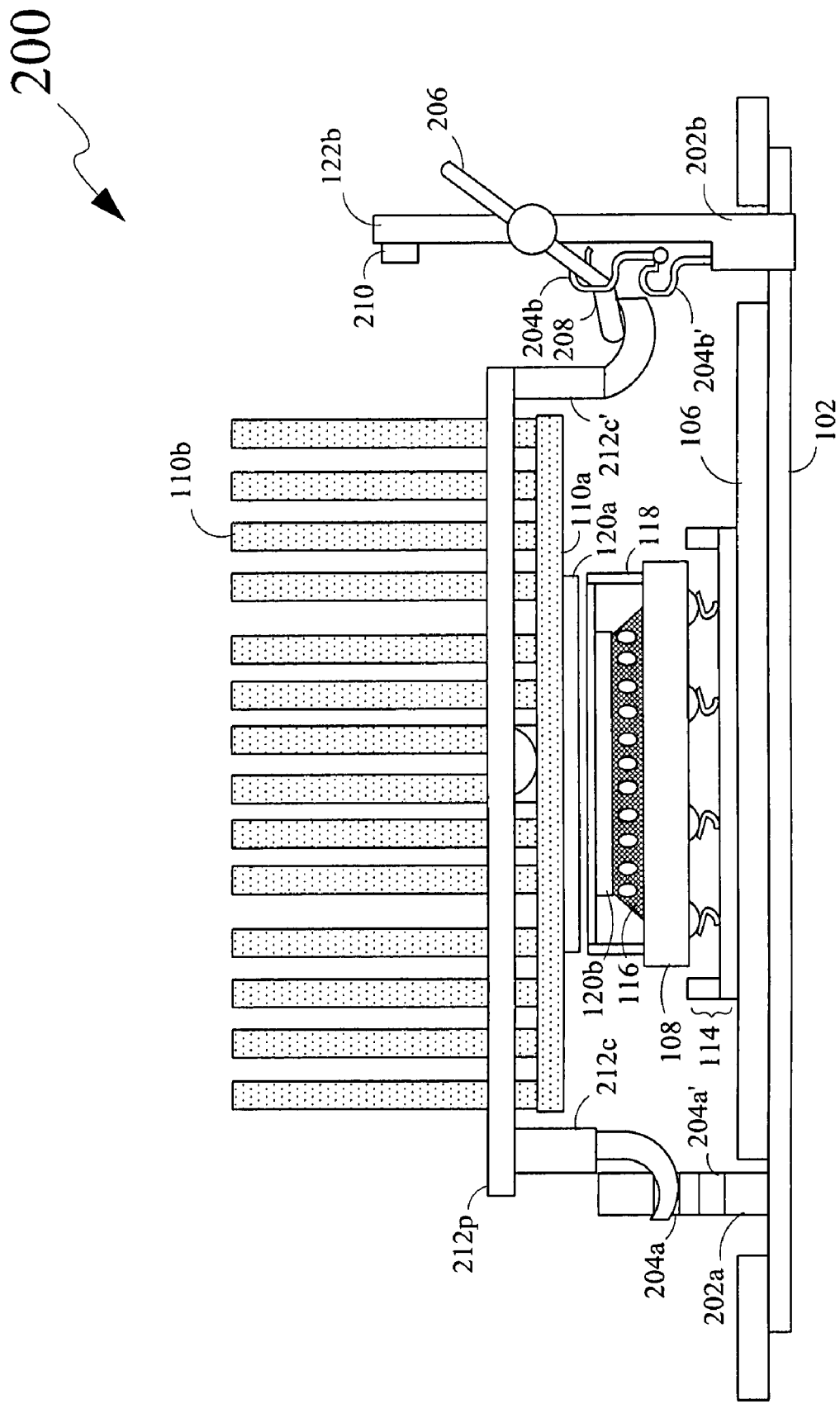
FIG. 2 is a front-view of a socket assembly, according to another exemplary embodiment of the present disclosure.

Referring now to FIG. 2, a front-view of a socket assembly 200 is shown, according to another exemplary embodiment of the present disclosure. The socket assembly 200 is similar to the socket assembly 100 except for the configuration of the retention mechanism and the loading mechanism. The retention mechanism includes the support plate 102 and a pair of standoffs such as a first standoff 202a and a second standoff 202b. The orientation of the first standoff 202a and the second standoff 202b to the support plate 102 are similar to that of the standoffs 104a and 104b of socket assembly 100, as described in conjunction with FIG. 1A. The first standoff 202a comprises a pair of grooves 204a and 204a' formed at different heights in the lateral surface of the first standoff 202a (see FIG. 2). As shown in FIG. 2, the second standoff 202b comprises a pair of hooks 204b and 204b'.

The retention mechanism further comprises a lever 206 pivotally coupled to the second standoff 202b. The lever 206 has an arm 208 that is adapted to engage to the hooks 204b and 204b'. The lever 206 is configured in a manner such that the lever 206 may facilitates the arm 208 a movement between the hook 204b and 204b'. Further, the second standoff 202b further comprises a stopper 210 configured on an end portion, which allows the lever 206 to have a movement in a fixed range. As discussed in conjunction with FIG. 1A, the height of the IC socket 108 is more in case of the IHS package as compared to the bare die package. Correspondingly, the groove 204a and the hook 204b may be formed and aligned at a same vertical height that depends upon the height of the IHS package. Similarly, the groove 204a' and the hook 204b' may be formed and aligned at same vertical height depending upon the height of the bare die package.

The loading mechanism includes a loading plate 212p and a pair of clips 212c and 212c'. As shown in FIG. 2, the shape of the clip 212c is similar to an arc which facilitates the clip 212c to fit into the grooves 204a or 204a'. However, the clip 212c may possess any shape other than the arc, so that the clip 212c may be engaged to the grooves 204a or 204a'. Further, the clip 212c' engages to the arm 208 of the lever 206. The lever 206 is adapted to provide the arm 208 a motion such that the arm 208 is engaged to the hooks 204b or 204b'. Subsequently, the clip 212c' may also be engaged to the hooks 204b or 204b' due to the connection with the arm 208 of the lever 206.

Based on the above discussions, it will be evident to a person skilled in the art that in cases of the die package 116 being the IHS package, the clip 212c is engaged to the groove 204a and the clip 212c' is engaged to the hook 204b through the arm 208. Accordingly, as shown in FIG. 2, the heat sink base 110a, the IC socket 108 at least partially accommodating IHS package and the circuit board 106 are sandwiched between the loading plate 212p and the support plate 102. Further, in cases of the die package 116 being the bare die package, the clip 212c is engaged to the groove 204a' and the clip 212c' is engaged to the hook 204b' through the arm 208. Accordingly, the heat sink base 110a, the IC socket 108 at least partially accommodating bare die package, and the circuit board 106 are sandwiched between the loading plate 212p and the support plate 102. In an embodiment of the present disclosure, the loading plate 212p is also configured to apply a varying load at various points of the heat sink base 110a due to a force from the lever 206 that is applied on the loading plate 212p through the clip 212c'.

Figure 3:
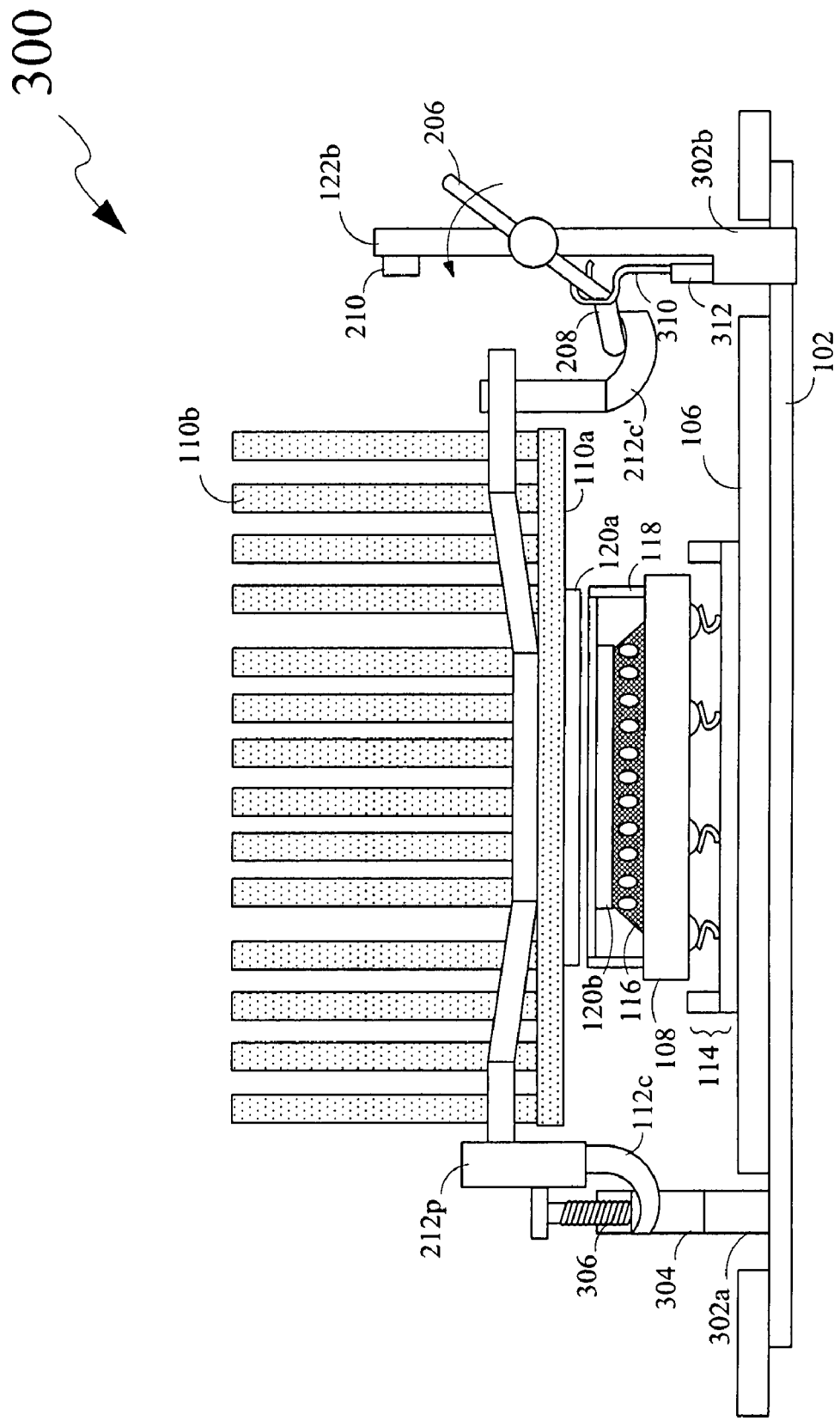
FIG. 3 is a front-view of a socket assembly, according to another exemplary embodiment of the present disclosure.

Referring now to FIG. 3, a front-view of a socket assembly 300 is shown, according to another exemplary embodiment of the present disclosure. The socket assembly 300 is similar to the socket assembly 200 except for the configuration of the retention mechanism. The retention mechanism includes the support plate 102 and a pair of standoffs such as a first standoff 302a and a second standoff 302b. The orientation of the first standoff 302a and the second standoff 302b to the support plate 102 are similar to that of the standoffs 104a and 104b of socket assembly 100, as described in conjunction with FIG. 1A.

The first standoff 302a comprises a groove 304. The groove 304 is configured in a manner such that a height of the groove 304 may be varied. Therefore, the first standoff 302a comprises suitable means to form a groove having variable height in a body of the first standoff 302a, such as the groove 304 (see FIG. 3). For example, the first standoff 302a may contain a movable portion 306 that is capable of forming a groove of variable height on the body of the first standoff 302a. As shown in FIG. 3, the movable portion is a screw structure that may be moved along a longitudinal axis of the first standoff 302a, thereby forming the groove 304 thereon, which is variable in height. For example, when the screw structure may be guided towards the support plate 102, the height of the groove 304, formed on the first standoff 302a, may be reduced. Similarly, the height of the groove 304 may be increased when the screw structure may be guided in the direction away from the support plate 102.

The second standoff 302b comprises a hook 310. As shown in FIG. 3, the hook 310 is attached to a base part 312 of the second standoff 302b and oriented in a perpendicular direction to the support plate 102. The hook 310 is configured in a manner such that a height of the hook 310 from the support plate 102 may be varied. In an arrangement, the hook 310 may comprise a spring structure or a screw structure (not shown) in the base part 312 that may provide a variable height to the hook 310. The socket assembly 300 further comprises the lever 206 pivotally coupled to the second standoff 302b. The lever 206 has the arm 208 that is engaged to the hook 310. The lever 206 is configured such that it may facilitate the hook 310 to vary the height from the support plate 102.

Based on the foregoing descriptions, it will be evident to a person skilled in the art that heights of both the groove 304 and the hook 310 may be varied. Accordingly, the variable heights of the groove 304 and the hook 310 may facilitate using a die package 116 of variable heights, which is at least partially accommodated in the IC socket 108. Therefore, the socket assembly 300 may be used to sandwich the heat sink base 110a, the IC socket 108 comprising various possible heights of the die package 116 and the circuit board 106 between the loading plate 212p and the support plate 102. It should be noted that this embodiment is not limited to the IHS packages or the bare die packages, and that various possible heights of the die package 116 may be incorporated in the socket assembly 300.

Various embodiments of the present disclosure provide a number of advantages. The present disclosure provides a common loading mechanism for a circuit board, an IC socket and a heat sink unit. The present disclosure incorporates the same retention mechanism for the circuit board, the IC socket and the heat sink unit. The present disclosure provides a loading mechanism and a retention mechanism in a socket assembly that may allow an option of using the bare die package and an IHS package in the socket assembly. Furthermore, an embodiment of the present disclosure provides flexibility in terms of the height of the die package, as die packages of various possible heights may be accommodated in the IC socket. The present disclosure also facilitates a variation in the load experienced on the heat sink unit and the IC socket. From the design perspective, the present disclosure may be implemented in a cost effective manner.

The foregoing descriptions of specific embodiments of the present disclosure have been presented for purposes of illustration and description. They are not intended to be exhaustive or to limit the present disclosure to the precise forms disclosed, and obviously many modifications and variations are possible in light of the above teaching. The embodiments were chosen and described in order to best explain the principles of the present disclosure and its practical application, to thereby enable others skilled in the art to best utilize the present disclosure and various embodiments with various modifications as are suited to the particular use contemplated. It is understood that various omission and substitutions of equivalents are contemplated as circumstance may suggest or render expedient, but such are intended to cover the application or implementation without departing from the spirit or scope of the claims of the present disclosure.

What is claimed is:

1. A socket assembly, comprising:
   a retention mechanism comprising,
      a support plate, and
      a plurality of standoffs disposed perpendicularly on opposite end portions of the support plate, each standoff of the plurality of standoff comprising a pair of latches extending outwardly at different heights from a lateral surface of the each standoff;
   a circuit board, wherein at least a portion of the circuit board is disposed on the support plate between the plurality of standoffs;
   an Integrated Circuit (IC) socket configured on the portion of the circuit board and adapted to at least partially accommodate a package including a die;
   a heat sink unit configured above the IC socket, the heat sink unit capable of conducting heat from at least one of the package and the die; and
   a loading mechanism comprising,
      a loading plate configured on end portions of the plurality of standoffs, and
      a pair of downwardly extending clips hinged at end portions of the loading plate respectively and capable of being engaged with a latch of the pair of latches from each of the plurality of standoffs, wherein a portion of the heat sink unit, the IC socket and the portion of the circuit board are adapted to be sandwiched between the support plate and the loading plate when the pair of downwardly extending clips are engaged with the latch from each of the plurality of standoffs, and wherein the pair of latches of the each standoff are hinged at different heights of the standoff based on a height of the package and the die to be at least partially accommodated in the IC socket.

2. The socket system of claim 1, wherein the heat sink unit comprises a heat sink base with a flat bottom surface configured on the IC socket; and a plurality of heat fins projecting outside from a top surface of the heat sink base for dissipating heat of the at least one of the package and the die.

3. A socket assembly, comprising:

a retention mechanism comprising, a support plate, a pair of standoffs disposed perpendicularly on opposite end portions of the support plate, wherein a first standoff of the pair of standoff comprises a pair of grooves at different heights of the first standoff and wherein a second standoff comprises a pair of hooks, and a lever pivotally coupled to the second standoff having an arm adapted to being engaged to each hook of the pair of hooks;

a circuit board, wherein at least a portion of the circuit board is disposed on the support plate between the pair of standoffs;

an Integrated Circuit (IC) socket configured on the portion of the circuit board to at least partially accommodate a package including a die;

a heat sink unit configured above the IC socket, the heat sink unit capable of conducting heat from at least one of the package and the die; and a loading mechanism comprising, a loading plate configured above the portion of the heat sink unit, and a pair of downwardly extending clips hinged at end portions of the loading plate, a first clip of the pair of downwardly extending clips capable of being engaged in a groove of the pair of grooves in the first standoff and a second clip of the pair of downwardly extending clips attached to the arm of the lever engaged to a hook of the pair of hooks of the second standoff, wherein a portion of the heat sink unit, the IC socket and the portion of the circuit board are adapted to be sandwiched between the support plate and the loading plate when the first clip is engaged in the groove in the first standoff and the lever is engaged in the hook of the second standoff, and wherein the pair of latches of the each standoff are hinged at different heights of the standoff based on a height of the package and the die to be at least partially accommodated in the IC socket.

4. The socket system of claim 3, wherein the heat sink unit comprises a heat sink base with a flat bottom surface configured on the IC socket; and a plurality of heat fins projecting outside from a top surface of the heat sink base for dissipating heat of the at least one of the package and the die.

5. The socket system of claim 3, wherein the package further includes a heat spreader.

6. The socket system of claim 3, wherein the pair of latches are hinged at a height corresponding to a size of an integrated heat spreader (IHS).

7. The socket system of claim 3, wherein the pair of latches are hinged at a height corresponding to a size of a bare-die package.

* * * * *